(12) United States Patent
Song et al.

(10) Patent No.: US 10,553,825 B2
(45) Date of Patent: Feb. 4, 2020

(54) ENCAPSULATION STRUCTURE, MANUFACTURING METHOD THEREOF AND DISPLAY APPARATUS

(71) Applicant: BOE Technology Group Co., Ltd., Beijing (CN)

(72) Inventors: Ping Song, Beijing (CN); Feifei Wang, Beijing (CN); Youwei Wang, Beijing (CN); Peng Cai, Beijing (CN); Jing Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/764,987

(22) PCT Filed: Sep. 12, 2017

(86) PCT No.: PCT/CN2017/101419
§ 371 (c)(1),
(2) Date: Mar. 30, 2018

(87) PCT Pub. No.: WO2018/171127
PCT Pub. Date: Sep. 27, 2018

(65) Prior Publication Data
US 2019/0058161 A1    Feb. 21, 2019

(30) Foreign Application Priority Data

Mar. 23, 2017 (CN) .......................... 2017 1 0178739

(51) Int. Cl.
*H01L 51/52* (2006.01)
*H01L 51/56* (2006.01)
*H01L 51/00* (2006.01)
*C09D 133/08* (2006.01)
*C09D 133/26* (2006.01)
*C09D 125/04* (2006.01)
*C09D 133/10* (2006.01)
*H01L 27/32* (2006.01)

(52) U.S. Cl.
CPC ........ *H01L 51/5256* (2013.01); *C09D 125/04* (2013.01); *C09D 133/08* (2013.01);
(Continued)

(58) Field of Classification Search
CPC ............... H01L 51/5256; H01L 51/004; H01L 51/0043; H01L 27/3211; C09D 133/10
(Continued)

(56) References Cited

U.S. PATENT DOCUMENTS 9,947,899 B2 * 4/2018 Liu ...................... H01L 51/004
2012/0146492 A1   6/2012 Ryu
(Continued)

FOREIGN PATENT DOCUMENTS

CN      101707237 A     5/2010
CN      201616434 U    10/2010
(Continued)

OTHER PUBLICATIONS

International Search Report for PCT Application No. PCT/CN2017/101419 dated Dec. 21, 2017.
(Continued)

*Primary Examiner* — Thinh T Nguyen
(74) *Attorney, Agent, or Firm* — Fay Sharpe LLP (57) ABSTRACT

An encapsulation structure, a manufacturing method thereof and a display apparatus are provided in the field of display device encapsulation. The encapsulation structure includes a plurality of film layers coated on the outside of a display device and the plurality of film layers include an inorganic layer and an organic layer that are laminated. The organic layer includes a polymer matrix and a repairing microstructure.

15 Claims, 6 Drawing Sheets

(52) U.S. Cl.
CPC ......... *C09D 133/10* (2013.01); *C09D 133/26* (2013.01); *H01L 51/004* (2013.01); *H01L 51/0043* (2013.01); *H01L 51/56* (2013.01); *H01L 27/3211* (2013.01); *H01L 27/3244* (2013.01); *H01L 2251/5338* (2013.01); *H01L 2251/568* (2013.01)

(58) Field of Classification Search
USPC ............................ 257/40, 59, 72; 438/82, 99
See application file for complete search history.

(56) References Cited

U.S. PATENT DOCUMENTS

| | | | | |
|---|---|---|---|---|
| 2014/0024765 | A1* | 1/2014 | Nunoshige | H01L 2924/181 524/549 |
| 2017/0092897 | A1* | 3/2017 | Liu | H01L 51/5259 |
| 2017/0351141 | A1* | 12/2017 | Kubota | H01L 27/124 |

FOREIGN PATENT DOCUMENTS

| | | |
|---|---|---|
| CN | 102153715 A | 8/2011 |
| CN | 102208558 A | 10/2011 |
| CN | 102610762 A | 7/2012 |
| CN | 103554840 A | 2/2014 |
| CN | 104103666 A | 10/2014 |
| CN | 105097881 A | 11/2015 |
| CN | 106409873 A | 2/2017 |
| CN | 106887531 A | 6/2017 |

OTHER PUBLICATIONS

Chinese Office Action for Chinese Application No. 201710178739.5 dated Jan. 19, 2018.

Chinese Office Action for Chinese Application No. 201710178739.5 dated Aug. 7, 2018.

* cited by examiner

ENCAPSULATION STRUCTURE, MANUFACTURING METHOD THEREOF AND DISPLAY APPARATUS

This application is a 371 of PCT Patent Application No. PCT/CN2017/101419 filed Sep. 12, 2017, which claims priority to Chinese Patent Application No. 201710178739.5, filed with the State Intellectual Property Office on Mar. 23, 2017 and titled "ENCAPSULATION STRUCTURE, MANUFACTURING METHOD THEREOF AND DISPLAY APPARATUS," the entire contents of which are incorporated herein by reference.

FIELD

The present disclosure relates to the field of display device encapsulation, and in particular to an encapsulation structure, a manufacturing method thereof and a display apparatus.

BACKGROUND

Organic light-emitting diode (OLED) devices are known as the most promising display devices due to their advantages of self-luminous, high brightness, high contrast, low operating voltage, and flexible display. However, components such as moisture and oxygen in the air greatly affect the service life of the OLED devices. Therefore, it is usually necessary to encapsulate an OLED device with an encapsulation structure to isolate the OLED device from the air, so as to extend the service life of the OLED device.

In the related art, the encapsulation structure includes an inorganic layer, an organic layer, and an inorganic layer sequentially overlaid on the outside of the OLED device. The inorganic layer has water resistance, and its main function is to isolate the OLED device from the external air. The organic layer has a certain bendability, and its main function is to realize the flexible display of the OLED device.

During the implementation of the present disclosure, at least the following problem has been found in the related art: during the flexible display, the bending process easily causes the encapsulation structure to be broken to form an air channel, which causes that the encapsulation structure cannot effectively encapsulate the OLED device. Therefore, the encapsulation structure has a poor encapsulation effect.

SUMMARY

The present disclosure provides an encapsulation structure for encapsulating a display device, a manufacturing method thereof and a display device, which may solve the problem that the encapsulation structure has a poor encapsulation effect. The technical solutions of the present disclosure are as follows:

In a first aspect, there is provided an encapsulation structure for encapsulating a display device. The encapsulation structure includes a plurality of film layers coated on the outside of the device. The plurality of film layers include an inorganic layer and an organic layer that are laminated, and the organic layer comprises a polymer matrix and a repairing microstructure.

In some embodiments, the repairing microstructure is in the form of a capsule that includes a capsule wall and a capsule core. The formation material of the capsule core comprises a repairing agent.

In some embodiments, the capsule wall of the repairing microstructure encloses a cavity, and the capsule core is in the cavity.

In some embodiments, the repairing agent is used for a reversible addition-fragmentation transfer radical polymerization reaction with the polymer matrix.

In some embodiments, the polymer matrix is formed from a polymerization reaction of a reactant mixture, the reactant mixture comprises a polymeric monomer, an initiator and a chain transfer agent, and the repairing agent comprises the polymeric monomer.

In some embodiments, the polymeric monomer comprises at least one of methyl methacrylate, ethyl methacrylate, acrylic acid, acrylamide, and styrene.

The initiator comprises at least one of azobisisobutyronitrile, methyl 2,2'-azobis (2-methylpropionate), 2,2-azobis, and benzoyl peroxide.

The chain transfer agent comprises at least one of α-methyl benzyl benzoate, cumyl dithiobenzeneacetate, and dibenzyl trithiocarbonate.

In some embodiments, the formation material of the capsule wall comprises melamine formaldehyde resin, urea formaldehyde resin, and gelatin.

In some embodiments, the formation material of the inorganic layer comprises at least one of silicon nitride, titanium dioxide, and silicon oxide In some embodiments, the formation process of the inorganic layer comprises a thin film encapsulation chemical vapor deposition process.

In some embodiments, the formation process of the organic layer comprises an ink-jet printing process or a coating process.

In some embodiments, the plurality of film layers are three film layers, and among the plurality of film layers, both the film layer close to the display device and the film layer away from the display device are inorganic layers.

In some embodiments, the encapsulation structure for encapsulating a display device further includes: a barrier layer disposed on the outside of the plurality of film layers, and a cover plate disposed on the barrier layer.

In some embodiments, the display device is disposed on a display area of a base substrate, and both the inorganic layer and the organic layer cover the display area.

In some embodiments, the display device comprises: an organic light emitting diode (OLED) device or a quantum dot light emitting diode (QLED) device.

In a second aspect, there is provided a method for manufacturing an encapsulation structure for encapsulating a display device. The method includes: forming an inorganic layer coated on the display device on the outside of the display device; and forming an organic layer coated on the inorganic layer on the outside of the inorganic layer, where the organic layer comprises a polymer matrix and a repairing microstructure.

In some embodiments, the polymeric matrix is formed from a polymerization reaction of a reactant mixture, and the reactant mixture comprises a polymeric monomer, an initiator, and a chain transfer agent, and the forming an organic layer coated on the inorganic layer on the outside of the inorganic layer includes: forming a mixture layer comprising the polymeric monomer, the initiator, the chain transfer agent, and the repairing microstructure on the outside of the inorganic layer through a preset process; and heating the mixture layer so that the polymeric monomer in the mixture layer undergoes a polymerization reaction under the action of the initiator and the chain transfer agent to obtain the organic layer.

The preset process comprises an ink-jet printing process or a coating process.

In some embodiments, heating the mixture layer comprises: heating the mixture layer so that the temperature of the mixture layer is within a preset temperature range, where the preset temperature range is 30 degrees Celsius to 70 degrees Celsius.

In some embodiments, before forming the mixture layer comprising the polymeric monomer, the initiator, the chain transfer agent, and the repairing microstructure on the outside of the inorganic layer through a preset process, the method further includes: forming the repairing microstructure; and mixing the polymeric monomer, the initiator, the chain transfer agent, and the repairing microstructure.

In some embodiments, forming an inorganic layer coated on the display device on the outside of the display device includes: forming the inorganic layer coated on the display device on the outside of the display device through a thin film encapsulation chemical vapor deposition process.

In a third aspect, there is provided a display apparatus. The display apparatus includes: a display device and the encapsulation structure for encapsulating a display device described in the first aspect. The display device includes an OLED device or a QLED device.

The technical solutions of the present disclosure may bring the following advantageous benefits:

The present disclosure provides an encapsulation structure for encapsulating a display device, a manufacturing method thereof and a display apparatus. The encapsulation structure includes a plurality of film layers coated on the outside of the display device and the plurality of film layers include an inorganic layer and an organic layer that are laminated. The organic layer includes a polymer matrix and a repairing microstructure. The repairing microstructure may repair air channels, such as cracks and through-holes, in the organic layer, so that the encapsulation structure can effectively encapsulate the display device, which solves the problem of the poor encapsulation effect of the encapsulation structure and improves the encapsulation effect.

It is to be understood that both the foregoing general description and the following detailed description are exemplary only, and are not intended to limit the present disclosure.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION OF THE EMBODIMENTS

The present disclosure will be described in further detail with reference to the enclosed drawings, to clearly present the objects, technique solutions, and advantages of the present disclosure.

An OLED device includes an electro luminescence (EL) layer which easily becomes ineffective due to the erosion by moisture and oxygen in the air, causing the OLED device to become ineffective. Therefore, how to effectively block moisture, oxygen, and the like becomes a main bottleneck limiting the application of OLED devices. At present, a hard substrate (such as a glass substrate) with a high water-resistant property is adopted in the industry to encapsulate an OLED device. The hard substrate can effectively protect the OLED device. However, it is difficult to realize the flexible display of the OLED device when the OLED device is encapsulated by using a hard substrate. In the related art, when the flexible display of an OLED device is implemented, the OLED device is usually encapsulated by using an encapsulation structure, and the encapsulation structure is usually a thin film encapsulation structure. The thin film encapsulation structure may be formed with a thin film encapsulation method.

Figure 1:
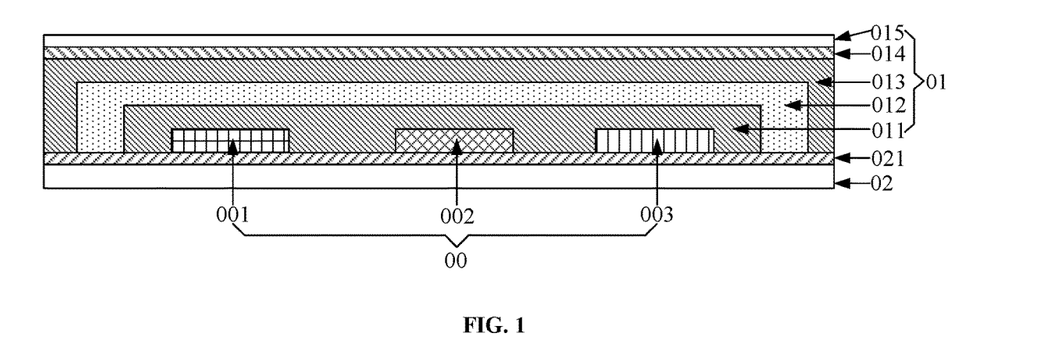
FIG. 1 is an application scenario diagram of an encapsulation structure provided in the related art.

Exemplarily, refer to FIG. 1, which shows an application scenario diagram of an encapsulation structure 01 provided in the related art. Referring to FIG. 1, the encapsulation structure 01 includes an inorganic layer 011, an organic layer 012, and an inorganic layer 013 sequentially laminated on the outside of an OLED device. The encapsulation structure 01 further includes a barrier layer 014 disposed on the inorganic layer 013 and a cover plate 015 disposed on the barrier layer 014. The inorganic layer 011 and the inorganic layer 013 have certain water resistance, but their bendability is poor, and their main function is to isolate the OLED device 00 from external air. The organic layer 012 has a certain bendability but its water resistance is poor, and its main function is to realize the flexible display of the OLED device 00. As shown in FIG. 1, a thin film transistor (TFT) layer 021 is disposed on a base substrate 02. The OLED device 00 is disposed on the base substrate 02, and the OLED device 00 includes an EL layer which includes a red light emitting unit 001, a green light emitting unit 002, and a blue light emitting unit 003.

However, the encapsulation structure needs to be bent to realize flexible display. The encapsulation structure 01 shown in FIG. 1 depends heavily on the film quality. After the OLED device 00 is encapsulated by using the encapsulation structure 01 shown in FIG. 1, the bending process easily causes the encapsulation structure 01 to be broken to form an air channel, resulting in deterioration of the performance of the encapsulation structure 01, and making it difficult for the encapsulation structure 01 to encapsulate the OLED device 100 effectively. Thus, the encapsulation structure 01 has a poor encapsulation effect.

Figure 2:
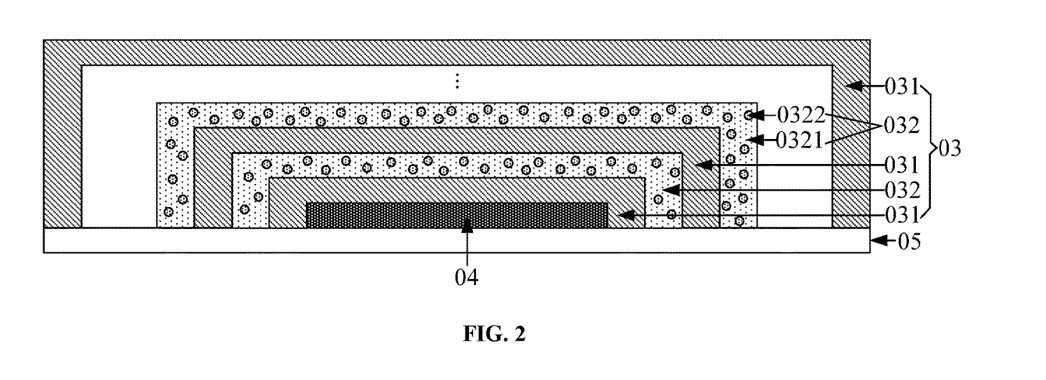
FIG. 2 is an application scenario diagram of an encapsulation structure provided in an embodiment of the present disclosure.

Refer to FIG. 2, which shows an application scenario diagram of an encapsulation structure 03 according to an embodiment of the present disclosure. Referring to FIG. 2, the encapsulation structure 03 includes a plurality of film layers coated on the outside of a display device 04. The plurality of film layers include an inorganic layer 031 and an organic layer 032 that are laminated, and the organic layer 032 includes polymer matrixes 0321 and repairing microstructures 0322. As shown in FIG. 2, the display device 04 is disposed on a base substrate 05.

In summary, in the encapsulation structure provided in the embodiment of the present disclosure, since the organic layer includes polymer matrixes and repairing microstructures, the repairing microstructures may repair air channels such as cracks and through-holes in the organic layer, so that the encapsulation structure can effectively encapsulate the display device, which solves the problem of the poor encapsulation effect of the encapsulation structure and improves the encapsulation effect.

In some embodiments, as shown in FIG. 2, the repairing microstructures 0322 are uniformly distributed among the polymer matrixes 0321. The microstructure 0322 has a shape of a capsule, and the repairing microstructure 0322 includes a capsule wall (not shown in FIG. 2) and a capsule core (not shown in FIG. 2). The material for forming the capsule wall may include melamine formaldehyde resin, urea formaldehyde resin, and gelatin. The material for forming the capsule core may include a repairing agent, and the repairing agent may include a polymeric monomer which may include at least one of methylmethacrylate, ethylmethacrylate, acrylic acid, acrylamide, and styrene. The polymeric monomer contains a vinyl group which facilitates the repair of the organic layer 032. The vinyl group in the polymeric monomer may undergo a reversible addition-fragmentation transfer radical polymerization reaction with a group (for example, a double bond) in the material of the polymer matrix 0321, so as to repair the air channels, such as cracks and through-holes in the organic layer 032, thereby repairing the organic layer 032.

In this embodiment of the present disclosure, the capsule wall of the repairing microstructure 0322 may enclose a cavity (not shown in FIG. 2), and the capsule core is in the cavity enclosed by the capsule wall. The repairing agent in the capsule core may repair in air channels, such as cracks and through-holes in the organic layer 032. In some embodiments, the repair agent in the capsule core includes a polymeric monomer containing a vinyl group that can undergo a reversible addition-fragmentation transfer radical polymerization reaction with a group (for example, a double bond) in the polymer matrix 0321. When air channels, such cracks and through-holes, are produced in the organic layer 032, the capsule wall of the repairing microstructure 0322 ruptures under the action of an extension stress of the air channels, and the repairing agent in the capsule core is released. The repairing agent undergoes a reversible addition-fragmentation transfer radical polymerization reaction with the polymer matrix 0321 to repair the air channels, such as cracks and through-holes, in the organic layer 032.

In some embodiments, in this embodiment of the present disclosure, the polymer matrix 0321 is formed by a polymerization reaction of a reactant mixture. The reactant mixture may include a polymeric monomer, an initiator, and a chain transfer agent. The polymeric monomer includes at least one of methyl methacrylate, ethyl methacrylate, acrylic acid, acrylamide, and styrene. The vinyl group in the polymeric monomer of the repairing agent may undergo a reversible addition-fragmentation transfer radical polymerization reaction with a vinyl group in the polymeric monomer of the polymer matrix 0321 to repair the air channels, such as cracks and through-holes, in the organic layer 032. The initiator may include at least one of azobisisobutyronitrile, methyl 2,2'-azobis (2-methylpropionate), 2,2-azobis, and benzoyl peroxide. The chain transfer agent may include at least one of α-methyl benzyl benzoate, cumyl dithiobenzeneacetate, and dibenzyl trithiocarbonate. In this embodiment of the present disclosure, under the action of the initiator and the chain transfer agent, the repairing agent can undergo the reversible addition-fragmentation transfer radical polymerization reaction with the polymer matrix 0321 under normal conditions without the need to apply additional reaction conditions, which facilitates the repair of the organic layer 032.

The repairing agent can undergo a reversible addition-fragmentation transfer radical polymerization reaction with the polymer matrix 0321 under normal conditions. That is, the repairing agent can undergo the reversible addition-fragmentation transfer radical polymerization reaction with the polymer matrix 0321 under a normal temperature and normal pressure without applying any reaction conditions. It should be noted that the polymeric monomer, the initiator, and the chain transfer agent listed in the embodiment of the present disclosure are merely exemplary, and are not intended to limit the present disclosure. In practice, other chemical materials may also be used to form the polymeric monomer, the initiator, and the chain transfer agent, which are not described in detail in the embodiment of the present disclosure.

Figure 3:
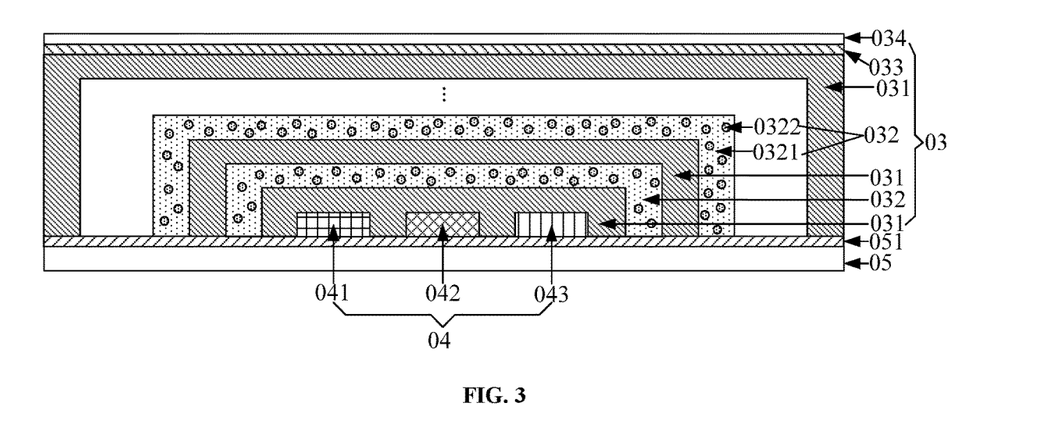
FIG. 3 is an application scenario diagram of another encapsulation structure provided in an embodiment of the present disclosure.
Figure 4:
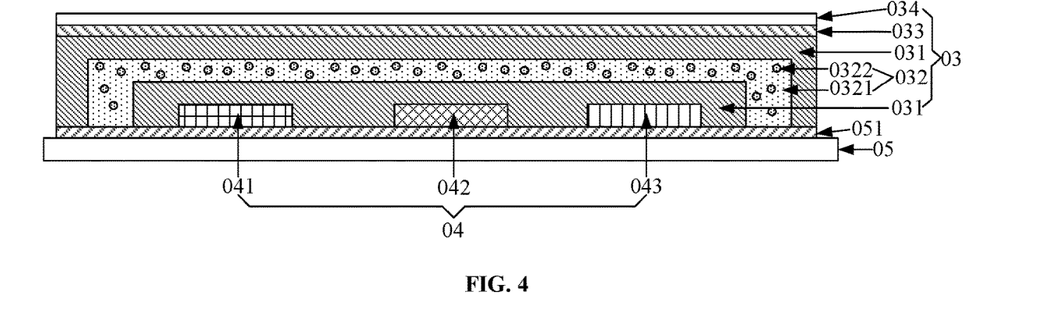
FIG. 4 is an application scenario diagram of yet another encapsulation structure provided in an embodiment of the present disclosure.

Further, referring to FIG. 3, which shows an application scenario diagram of another encapsulation structure 03 provided in accordance with an embodiment of the present disclosure. Referring to FIG. 3, the encapsulation structure 03 further includes a barrier layer 033 disposed on the outside of a plurality of film layers, and a cover plate 034 disposed on the barrier layer 033. The barrier layer 033 may be formed by silicon dioxide or silicon nitride. The cover plate 034 may be a transparent substrate, which may be a substrate made of a light-guiding and non-metal material with a certain rigidity such as glass, quartz, or transparent resin. Alternatively, the cover plate 034 may also be a flexible substrate, and the cover plate 034 may be a flexible substrate formed by polyimide (PI). The cover plate 034 is disposed on the flexible substrate to facilitate the flexible display of the display device. In the embodiment of the present disclosure, optionally, as shown in FIG. 4, the plurality of film layers are three film layers, and among the plurality of film layers, both the film layer close to the display device 04 and the film layer away from the display device 04 are inorganic layers 031. The film layer close to the display device 04 may be a film layer that is in contact with the display device 04 among the plurality of film layers. The film layer away from the display device 04 may be a film layer that is the furthest from the display device 04 among the plurality of film layers.

Figure 5:
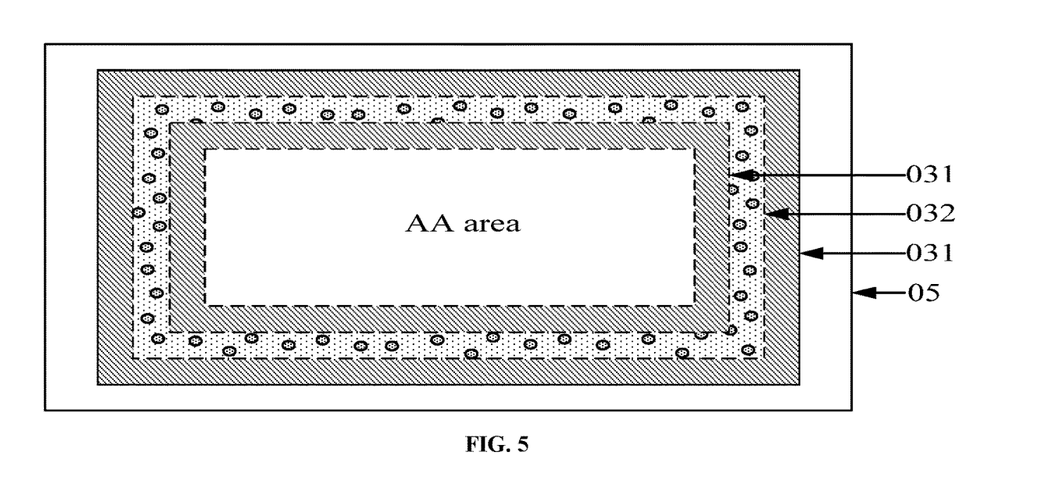
FIG. 5 is a top view of an encapsulation structure provided in an embodiment of the present disclosure.

Optionally, in the embodiment of the present disclosure, the display device 04 may be a display device, and the display device may be an OLED device or a quantum dot light emitting diode (QLED) device. The display device 04 being an OLED device is taken as an example in FIG. 2 to FIG. 4. As shown in FIG. 3 or FIG. 4, the display device 04 includes an organic light emitting layer, which may be an EL layer and may include a red light emitting unit 041, a green light emitting unit 042, and a blue light emitting unit 043. Certainly, in practice, the organic light emitting layer may further include light emitting units of other colors. For example, the organic light emitting layer may further include a black light emitting unit, which is described again in the embodiment of the present disclosure. As shown in FIG. 2 to FIG. 4, the OLED device (i.e., the display device 04) is disposed on a base substrate 05. For example, as shown in FIG. 5, the base substrate 05 may include a display area and a non-display area of the base substrate 05 may be an annular area (usually a square annular area) on the surface of the base substrate 05 near the edge, and the non-display area surrounds the display area. The display area is also commonly referred to as an active area (AA), and the non-display area is an area other than the display area on the first substrate. As shown in FIG. 5, the OLED device is disposed on the display area of the base substrate 05. Both the inorganic layer 031 and the organic layer 032 cover the display area of the base substrate 05.

Optionally, in the embodiment of the present disclosure, the base substrate 05 may be a transparent substrate, which may be a substrate made of a light-guiding and non-metal material with a certain rigidity such as glass, quartz, or transparent resin. Furthermore, a flexible substrate (not shown in FIG. 2 to FIG. 5) may usually be provided on the base substrate 05. The OLED device may be disposed on the flexible substrate. After the encapsulation structure 03 is formed, the base substrate 05 may be stripped from the flexible substrate to realize flexible display with the flexible substrate. The flexible substrate may be formed by Polyimide. In the embodiment of the present disclosure, the material for forming the inorganic layer 031 may include at least one of SiNx, TiO2, and SiOx, and the inorganic layer 031 may be formed through a thin film encapsulation chemical vapor deposition (TFE CVD) process, and the organic layer 032 may be formed on the inorganic layer 031 through an ink-jet printing (IJP) process or a coating process. For example, a mixture layer containing a polymeric monomer, an initiator, a chain transfer agent, and a repairing microstructure may be first ink-jet printed or coated on the inorganic layer 031 to obtain a mixture layer, and then the mixture layer may be heated so that the polymeric monomer in the mixture layer undergoes a polymerization reaction under the action of the initiator and the chain transfer agent to obtain the organic layer 032. The mixture layer may be heated so that the temperature of the mixture layer is within a preset temperature range of 30 degrees Celsius to 70 degrees Celsius. In actual implementation, the substrate formed with the mixture layer may be placed in an environment of 30 degrees Celsius to 70 degrees Celsius for a preset duration. In the environment of 30 degrees Celsius to 70 degrees Celsius, the polymeric monomer may undergo a polymerization reaction within a preset period of time under the action of the initiator and the chain transfer agent, to form the organic layer 032. It should be noted that the preset duration may generally be changed, and the preset duration is related to the temperature. For example, in the temperature range from 30 degrees Celsius to 70 degrees Celsius, the higher the temperature is, the shorter the preset duration is.

Figure 6:
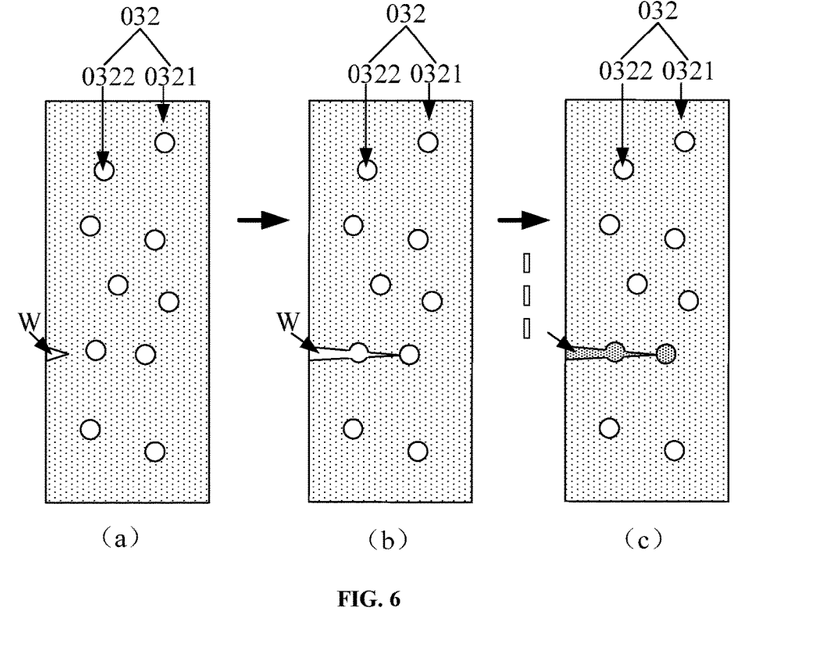
FIG. 6 is schematic diagram of a repairing process for a repairing microstructure provided in an embodiment of the present disclosure.
Figure 7:
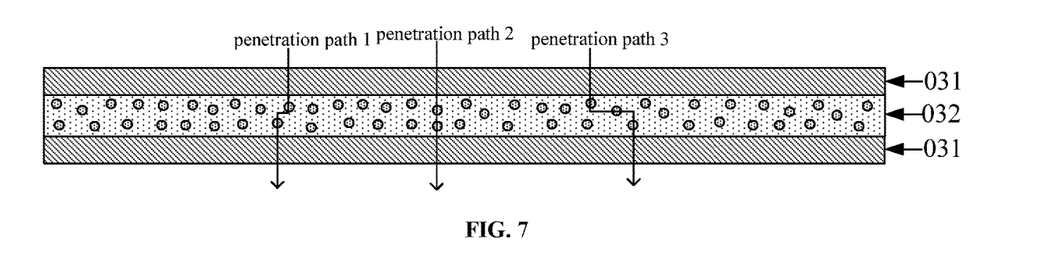
FIG. 7 is a schematic diagram of a penetration path of water molecules in the encapsulation structure provided in an embodiment of the present disclosure.

Refer to FIG. 6, which shows a schematic diagram of a repairing process using the repairing microstructure provided in accordance with an embodiment of the present disclosure. Referring to part (a) to part (c) in FIG. 6, during the use of the encapsulation structure (not shown in FIG. 6), as shown in part (a) in FIG. 6, a crack W is produced in the organic layer 032 under an external force (for example, an external force applied during bending). As the crack W extends, as shown in part (b) FIG. 6, the repairing microstructure 0322 at the expanding front of the crack W ruptures under the expanding force of the crack W. As shown in part (c) in FIG. 6, the repairing agent coated in the repairing microstructure 0322 is released into the crack W under the capillary force and undergoes a reversible addition-fragmentation radical transfer polymerization reaction with the polymer matrix 0321 of the organic layer 032 on the fracture surface of the crack W, to bond the crack W together to repair the crack W and prevent the crack W from further expanding, which realizes the self-repairing of the organic layer 032, and thus realizes the self-repairing of the encapsulation structure 03 and extends the service life of the encapsulation structure 03. In addition, in the embodiment of the present disclosure, the repairing microstructure 0322 can guide water molecules, extend the penetration path of the water molecules, and improve the water resistance of the encapsulation structure 03. For example, referring to FIG. 7, which shows a schematic diagram of a penetration path of water molecules in the encapsulation structure in accordance with an embodiment of the present disclosure. Referring to FIG. 7, the organic layer 032 has the repairing microstructure (not shown in FIG. 7). The existence of the repairing microstructure enables a contact surface to be formed between the polymer matrix in the organic layer 032 and the repairing microstructure, and water molecules are generally more likely to penetrate along the contact surface between different media. Therefore, water molecules are more likely to penetrate along the penetration path 1 and the penetration path 3 in FIG. 7, so that the penetration path of water molecules is lengthened, and the water resistance of the encapsulation structure 03 is improved. In the embodiment of the present disclosure, the existence of the repairing microstructure can improve the toughness of the organic layer 032, disperse the stress of the inorganic layer 031 to prevent the stress of the inorganic layer 031 from being the excessively concentrated, reduce the probability of fracture deterioration in the bending process of the inorganic layer 031, improve the bendability of the encapsulation structure 03, and extend the encapsulation life of the encapsulation structure 03, thereby further extending the service life of the display device.

In summary, in the encapsulation structure provided in the embodiment of the present disclosure, since the organic layer includes polymer matrixes and repairing microstructures, the repairing microstructures may repair air channels, such as cracks and through-holes, in the organic layer, so that the encapsulation structure can effectively encapsulate the display device, which solves the problem of the poor encapsulation effect of the encapsulation structure and improves the encapsulation effect. Additionally, the encapsulation structure provided in the embodiment of the present disclosure has a simple structure and may be easily manufactured.

Figure 8:
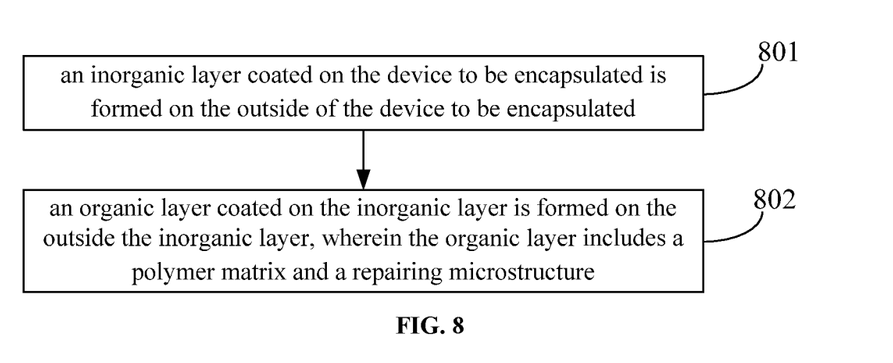
FIG. 8 is a flow chart of a method for manufacturing an encapsulation structure provided in an embodiment of the present disclosure.

Referring to FIG. 8, which shows a flow chart of a method for manufacturing an encapsulation structure provided in an embodiment of the present disclosure. This method may be used to manufacture the encapsulation structure 03 shown in any of FIG. 2 to FIG. 4. Referring to FIG. 8, the method includes the following steps.

In step 801, an inorganic layer coated on the display device is formed on the outside of the display device.

In step 802, an organic layer coated on the inorganic layer is formed on the outside of the inorganic layer, where the organic layer comprises a polymer matrix and a repairing microstructure.

In summary, with the method for manufacturing an encapsulation structure provided in the embodiment of the present disclosure, since the organic layer includes a polymer matrix and a repairing microstructure, the repairing microstructure may repair air channels, such as cracks and through-holes, in the organic layer, so that the encapsulation structure can effectively encapsulate the display device, which solves the problem of the poor encapsulation effect of the encapsulation structure and improves the encapsulation effect.

In some embodiments, the polymeric matrix is formed from a polymerization reaction of a reactant mixture, and the reactant mixture comprises a polymeric monomer, an initiator, and a chain transfer agent. Step 802 includes: forming a mixture layer comprising the polymeric monomer, the initiator, the chain transfer agent and the repairing microstructure on the outside of the inorganic layer through a preset process; and heating the mixture layer so that the polymeric monomer in the mixture layer undergoes a polymerization reaction under the action of the initiator and the chain transfer agent to obtain the organic layer.

The preset process comprises an ink-jet printing process or a coating process.

In some embodiments, heating the mixture layer comprises: heating the mixture layer so that the temperature of the mixture layer is within a preset temperature range from 30 degrees Celsius to 70 degrees Celsius.

In some embodiments, before forming the mixture layer comprising the polymeric monomer, the initiator, the chain transfer agent, and the repairing microstructure on the outside of the inorganic layer through a preset process, the method further includes: forming the repairing microstructure; and mixing the polymeric monomer, the initiator, the chain transfer agent, and the repairing microstructure.

In some embodiments, step 801 includes: forming the inorganic layer coated on the display device on the outside of the display through a thin film encapsulation chemical vapor deposition process.

All of the selectable technique solutions described above may be selected in any combination to form alternative embodiments of the present disclosure, and will not be described again herein.

In summary, with the encapsulation method provided in the embodiment of the present disclosure, since the organic layer includes polymer matrixes and repairing microstructures, the repairing microstructures may repair air channels, such as cracks and through-holes, in the organic layer, so that the encapsulation structure can effectively encapsulate the display device, which solves the problem of the poor encapsulation effect of the encapsulation structure and improves the encapsulation effect.

Figure 9:
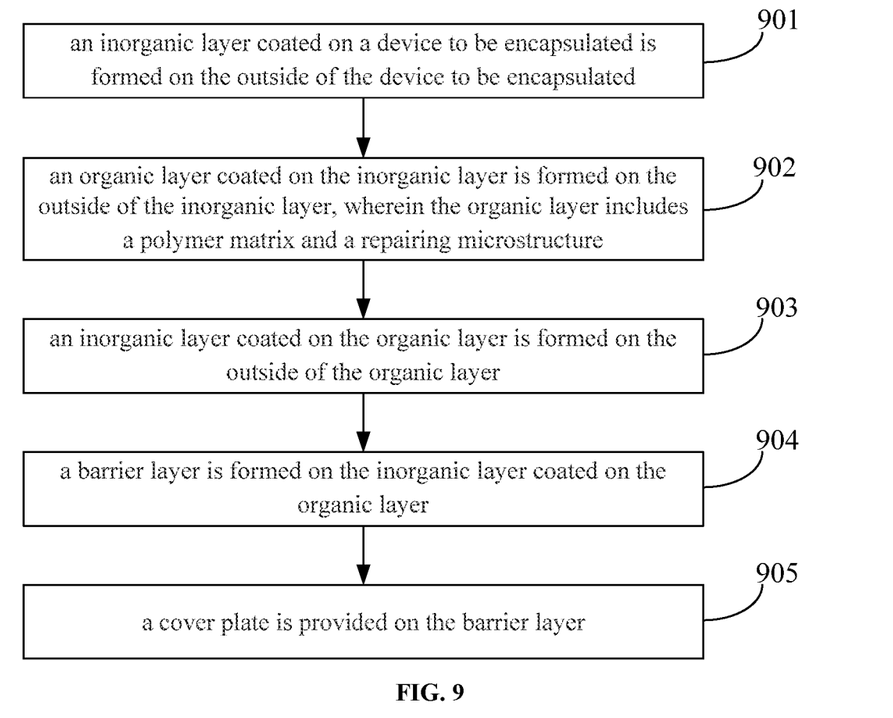
FIG. 9 is a flow chart of a method for manufacturing another encapsulation structure provided in an embodiment of the present disclosure.

Refer to FIG. 9, which shows a flowchart of a method for manufacturing an encapsulation structure in accordance with an embodiment of the present disclosure. This embodiment is described by taking an example in which the encapsulation structure shown in FIG. 4 is manufactured. For the method for manufacturing the encapsulation structure shown in FIG. 2 and FIG. 3, reference may be made to the method shown in FIG. 9. Referring to FIG. 9, the method includes the following steps.

In step 901, an inorganic layer coated on a display device is formed on the outside of the display device.

As shown in FIG. 4, a display device 04 is disposed on a base substrate 05. Exemplarily, a TFT layer 051 is provided on the base substrate 05. The TFT layer 051 may include a plurality of TFTs. The display device 04 is disposed on the TFT Layer 051. It can be seen from FIG. 4 that in the embodiment of the present disclosure, an inorganic layer 031 coated on the display device 04 is formed on the outside of the display device 04. That is, the inorganic layer 031 is formed on the base substrate 05 on which the display device 04 is formed, and the inorganic layer 031 covers the outside of the display device 04.

Figure 10:
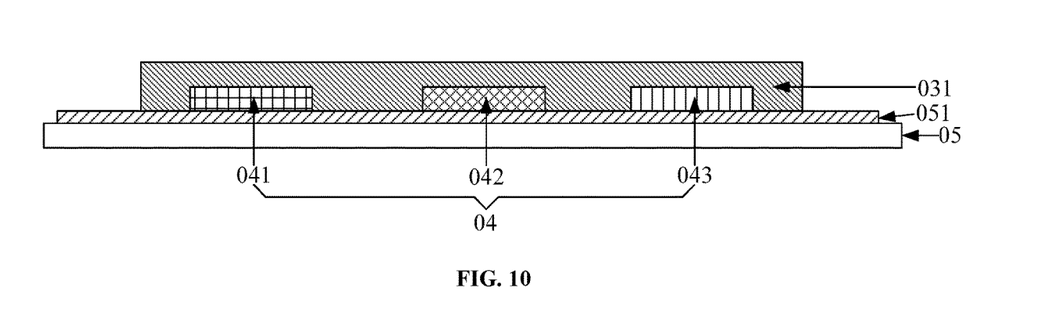
FIG. 10 is a schematic diagram after an inorganic layer coated on a display device to be encapsulated is formed on the outside of the display device provided in an embodiment of the present disclosure.

Refer to FIG. 10, which shows a schematic diagram of the base substrate 05 provided with the display device 04 after the inorganic layer 031 is formed on the base substrate 05 provided in accordance with an embodiment of the present disclosure. A TFE CVD process may be adopted to deposit a layer of SiNx on the base substrate 05 on which the display device 04 is formed to form a SiNx layer, and then the SiNx layer is processed through a single patterning process to obtain the inorganic layer 031. The single patterning process includes photoresist coating, exposure, developing, etching, and photoresist stripping. Therefore, processing the SiNx layer through the single patterning process to obtain the inorganic layer 031 includes: coating a layer of photoresist on the SiNx layer to obtain a photoresist layer, exposing the photoresist layer with a mask plate to form a fully exposed area and a non-exposed area on the photoresist layer, processing the exposed photoresist layer through a developing process to remove the photoresist in the fully exposed area and retain the photoresist in the non-exposed area, etching the area on the SiNx layer corresponding to the fully exposed area, and finally stripping off the photoresist in the non-exposed area, to form the inorganic layer 031 in the area on the SiNx layer corresponding to the non-exposed area. It should be noted that the embodiment of the present disclosure is described by taking an example in which a positive photoresist is used to form the inorganic layer 031. In practice, a negative photoresist may also be used to form the inorganic layer 031, which is not repeated in detail in the embodiment of the present disclosure.

In step 902, an organic layer coated on the inorganic layer is formed on the outside of the inorganic layer, where the organic layer includes a polymer matrix and a repairing microstructure.

In the embodiment of the present disclosure, the polymer matrix is formed from a polymerization reaction of a reactant mixture which may include a polymeric monomer, an initiator, and a chain transfer agent.

In the embodiment of the present disclosure, a repairing microstructure may be formed first. The repairing microstructure is in the form of a capsule that includes a capsule wall and a capsule core. The material for forming the capsule wall may include melamine formaldehyde resin, urea formaldehyde resin, and gelatin. The material for forming the capsule core may include a repairing agent, and the repairing agent may include a polymeric monomer. The polymeric monomer includes at least one of methyl methacrylate, ethyl methacrylate, acrylic acid, acrylamide, and styrene. Therefore, forming the repairing microstructure may include: forming the capsule wall using melamine formaldehyde resin, urea formaldehyde resin, and gelatin, forming the repairing agent using at least one of methyl methacrylate, ethyl methacrylate, acrylic acid, acrylamide, and styrene, taking the repairing agent as the material of the capsule core, and then placing the repairing agent in a cavity enclosed by the capsule wall to obtain the repairing microstructure. That is, the repairing agent is taken as the material of the capsule core and is placed in the cavity enclosed by the capsule wall to obtain the repairing microstructure. It should be noted that the embodiment of the present disclosure merely briefly describes how to form the repairing microstructure, and for details of forming the repairing microstructure, reference may be made to the related art, which is not described herein again in the embodiment of the present disclosure.

The polymeric monomer may include at least one of methyl methacrylate, ethyl methacrylate, acrylic acid, acrylamide, and styrene. The initiator may include at least one of azobisisobutyronitrile, methyl 2,2'-azobis (2-methylpropionate), 2,2-azobis, and benzoyl peroxide. The chain transfer agent may include at least one of α-methyl benzyl benzoate, cumyl dithiobenzeneacetate, and dibenzyl trithiocarbonate. Therefore, the polymeric monomer may be formed using at least one of methyl methacrylate, ethyl methacrylate, acrylic acid, acrylamide, and styrene, the initiator may be formed using at least one of azobisisobutyronitrile, methyl 2,2'-azobis (2-methylpropionate), 2,2-azobis, and benzoyl peroxide, and the chain transfer agent may be formed using at least one of α-methyl benzyl benzoate, cumyl dithiobenzeneacetate, and dibenzyl trithiocarbonate.

After the repairing microstructure is formed, the polymeric monomer, the initiator, the chain transfer agent, and the repairing microstructure may be mixed to obtain a mixture, then a mixture layer including the polymeric monomer, the initiator, the chain transfer agent, and the repairing microstructure may be formed on the outside of the inorganic layer using the mixture including the polymeric monomer, the initiator, the chain transfer agent, and the repairing microstructure by a preset process, and finally the mixture layer is heated so that the polymeric monomer in the mixture layer undergoes a polymerization reaction under the action of the initiator and the chain transfer agent to obtain the organic layer.

It should be noted that the mixture here is different from the reactant mixture. The mixture described here refers to a mixture formed by mixing the polymeric monomer, the initiator, the chain transfer agent, and the repairing microstructure, and the reactant mixture refers to a mixture formed by mixing the polymeric monomer, the initiator, and the chain transfer agent.

Figure 11:
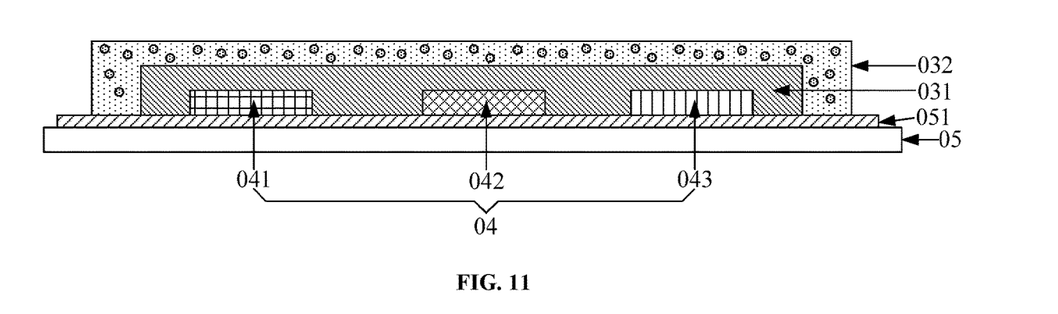
FIG. 11 is a schematic diagram after an organic layer coated on an inorganic layer is formed on the outside of the inorganic layer provided in an embodiment of the present disclosure.

The preset process may include an ink-jet printing process or a coating process. For example, refer to FIG. 11, which shows a schematic diagram after the organic layer 032 covering the inorganic layer 031 is formed on the outside of the inorganic layer 031 provided in accordance with an embodiment of the present disclosure. Referring to FIG. 11, the organic layer 032 is coated on the outside of the inorganic layer 031. In the embodiment of the present disclosure, the mixture including the polymeric monomer, the initiator, the chain transfer agent, and the repairing microstructure may be coated (or ink-jet printed) on the outside of the inorganic layer 031 to obtain the mixture layer, and then the mixture layer may be heated so that the polymeric monomer in the mixture layer undergoes a polymerization reaction under the action of the initiator and the chain transfer agent to obtain the organic layer 032. The mixture layer may be heated so that the temperature of the mixture layer is within a preset temperature range of 30 degrees Celsius to 70 degrees Celsius. In actual implementation, a substrate formed with the mixture layer may be placed in an environment of 30 degrees Celsius to 70 degrees Celsius for a preset duration. In the environment of 30 degrees Celsius to 70 degrees Celsius, the polymeric monomer may undergo a polymerization reaction within a preset period of time under the action of the initiator and the chain transfer agent to obtain the organic layer 032. The preset duration may be set in accordance with actual needs, and the preset duration may generally be changed. The preset duration is related to the temperature. For example, in the temperature range from 30 degrees Celsius to 70 degrees Celsius, the higher the temperature is, the shorter the preset duration is.

In step 903, an inorganic layer coated on the organic layer is formed on the outside of the organic layer.

Figure 12:
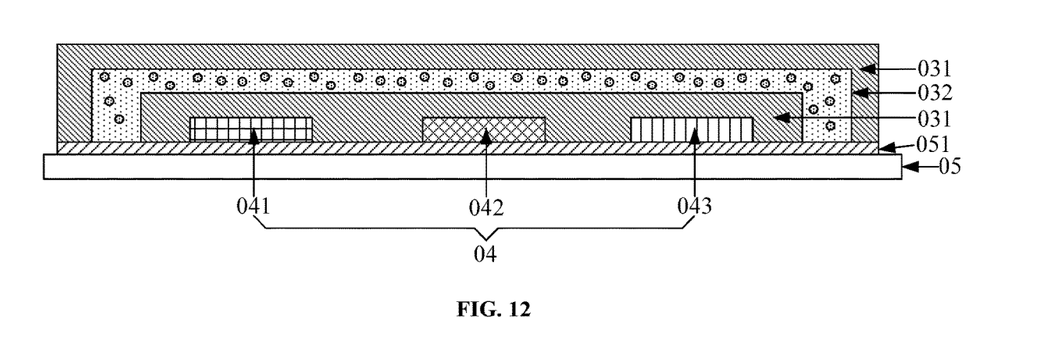
FIG. 12 is a schematic diagram after an inorganic layer coated on an organic layer is formed on the outside of the organic layer provided in an embodiment of the present disclosure.

Refer to FIG. 12, which shows a schematic diagram after an inorganic layer 031 coated on the organic layer 032 is formed on the outside of the organic layer 032 provided in accordance with an embodiment of the present disclosure. Referring to FIG. 12, the inorganic layer 031 is coated on the outside of the organic layer 032. For the implementation process of step 903, reference may be made to step 901, and details are not repeated in the embodiment of the present disclosure.

In step 904, a barrier layer is formed on the inorganic layer coated on the organic layer.

Figure 13:
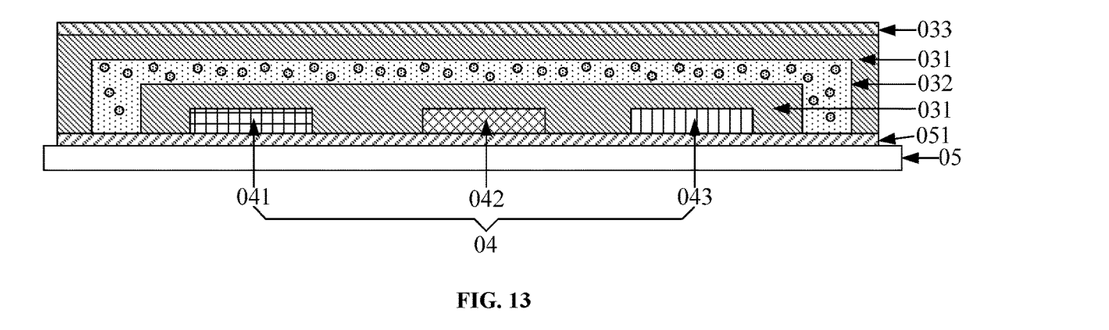
FIG. 13 is a schematic diagram after a barrier layer is formed on an inorganic layer coated on an organic layer provided in an embodiment of the present disclosure.

Refer to FIG. 13, which shows a schematic diagram after a barrier layer 033 is formed on the inorganic layer 031 coated on the organic layer 032 in accordance with an embodiment of the present disclosure. The barrier layer 033 may be formed by silicon dioxide or silicon nitride, and the thickness of the barrier layer 033 may be set based on actual needs. For example, a layer of silicon dioxide may be deposited on the inorganic layer 031 coated on the organic layer 032 with a method, such as coating, magnetron sputtering, thermal evaporation, or plasma enhanced chemical vapor deposition (PECVD), to obtain a silicon dioxide layer, and then the silicon dioxide layer is processed through a single patterning process to obtain the barrier layer 033. The process of processing the silicon dioxide layer through a single patterning process to obtain the barrier layer 033 is similar to the process of processing the SiNx layer through a single patterning process to obtain the inorganic layer 031, and details are not repeated in the embodiment of the present disclosure.

In step 905, a cover plate is provided on the barrier layer.

The schematic diagram after a cover plate 034 is provided on the barrier layer 033 may be referred to FIG. 4. The cover plate may be a transparent substrate, or may be a flexible substrate. Exemplarily, an optical adhesive may be used to attach the cover plate 034 onto the barrier layer 033. The optical adhesive may be, for example, an optically clear adhesive (OCA). For the process of disposing the cover plate 034 on the barrier layer 033, reference may be made to the related art, and the details will not be repeated in the embodiment of the present disclosure.

In summary, with the method for manufacturing the encapsulation structure provided in the embodiment of the present disclosure, since the organic layer includes polymer matrixes and repairing microstructures, the repairing microstructures may repair air channels, such as cracks and through-holes, in the organic layer, so that the encapsulation structure can effectively encapsulate the display device, which solves the problem of the poor encapsulation effect of the encapsulation structure and improves the encapsulation effect.

An embodiment of the present disclosure further provides a display apparatus. The display apparatus may include: a display device and an encapsulation structure. The encapsulation structure may be any encapsulation structure 03 shown in FIG. 2 to FIG. 4, and the display device may be an OLED device or a QLED device.

In summary, in the display apparatus provided in the embodiment of the present disclosure, since the organic layer includes polymer matrixes and repairing microstructures, the repairing microstructures may repair air channels, such as cracks and through-holes, in the organic layer, so that the encapsulation structure can effectively encapsulate the display device, which solves the problem of the poor encapsulation effect of the encapsulation structure and improves the encapsulation effect.

Persons of ordinary skill in the art can understand that all or part of the steps described in the above embodiments can be completed through hardware, or through relevant hardware instructed by applications stored in a non-transitory computer readable storage medium, such as read-only memory, disk or CD, etc.

The foregoing are only some embodiments of the present disclosure, and are not intended to limit the present disclosure. Within the spirit and principles of the disclosure, any modifications, equivalent substitutions, improvements, etc., are within the scope of protection of the present disclosure.

What is claimed is:

1. An encapsulation structure for encapsulating a display device, comprising a plurality of film layers coated on the outside of the display device, wherein the plurality of film layers comprises an inorganic layer and an organic layer that are overlaid, and the organic layer comprises a polymer matrix and a repairing microstructure,
   wherein the repairing microstructure is in the form of a capsule comprising a capsule wall and a capsule core, and a formation material of the capsule core comprises a repairing agent;
   the capsule wall of the repairing microstructure encloses a cavity, and the capsule core is in the cavity;
   the repairing agent is used for a reversible addition-fragmentation transfer radical polymerization reaction with the polymer matrix;
   the polymer matrix is formed from a polymerization reaction of a reactant mixture, the reactant mixture comprises a polymeric monomer, an initiator, and a chain transfer agent, and the repairing agent comprises the polymeric monomer; and
   a formation material of the capsule wall comprises melamine formaldehyde resin, urea formaldehyde resin, and gelatin.

2. The encapsulation structure according to claim 1, wherein
   the polymeric monomer comprises at least one of methyl methacrylate, ethyl methacrylate, acrylic acid, acrylamide, and styrene;
   the initiator comprises at least one of azobisisobutyronitrile, methyl 2,2'-azobis (2-methylpropionate), 2,2-azobis, and benzoyl peroxide; and
   the chain transfer agent comprises at least one of α-methyl benzyl benzoate, cumyl dithiobenzeneacetate, and dibenzyl trithiocarbonate.

3. The encapsulation structure according to claim 1, wherein a formation material of the inorganic layer comprises at least one of silicon nitride, titanium dioxide, and silicon oxide.

4. The encapsulation structure according to claim 1, wherein a formation process of the inorganic layer comprises a thin film encapsulation chemical vapor deposition process.

5. The encapsulation structure according to claim 1, wherein a formation process of the organic layer comprises an ink-jet printing process or a coating process.

6. The encapsulation structure according to claim 1, wherein the plurality of film layers are three film layers, and among the plurality of film layers, a film layer close to the display device and a film layer away from the display device are both inorganic layers.

7. The encapsulation structure according to claim 1, wherein the encapsulation structure further comprises: a barrier layer disposed on the outside of the plurality of film layers, and a cover plate disposed on the barrier layer.

8. The encapsulation structure according to claim 1, wherein the display device is disposed on a display area of a base substrate, and both the inorganic layer and the organic layer cover the display area.

9. The encapsulation structure according to claim 8, wherein the display device comprises: an organic light emitting diode (OLED) device or a quantum dot light emitting diode (QLED) device.

10. A method for manufacturing an encapsulation structure of a display device, wherein the method comprises:
    forming an inorganic layer coated on the display device on the outside of the display device; and
    forming an organic layer coated on the inorganic layer on the outside of the inorganic layer,
    wherein the encapsulation structure for encapsulating a display device, comprising a plurality of film layers coated on the outside of the display device, wherein the plurality of film layers comprises the inorganic layer and the organic layer that are overlaid, and the organic layer comprises a polymer matrix and a repairing microstructure,
    wherein the repairing microstructure is in the form of a capsule comprising a capsule wall and a capsule core, and a formation material of the capsule core comprises a repairing agent;
    the capsule wall of the repairing microstructure encloses a cavity, and the capsule core is in the cavity;
    the repairing agent is used for a reversible addition-fragmentation transfer radical polymerization reaction with the polymer matrix;
    the polymer matrix is formed from a polymerization reaction of a reactant mixture, the reactant mixture comprises a polymeric monomer, an initiator, and a chain transfer agent, and the repairing agent comprises the polymeric monomer; and
    a formation material of the capsule wall comprises melamine formaldehyde resin, urea formaldehyde resin, and gelatin.

11. The method of claim 10, wherein the polymeric matrix is formed from a polymerization reaction of a reactant mixture, and the reactant mixture comprises a polymeric monomer, an initiator, and a chain transfer agent, and forming the organic layer coated on the inorganic layer on the outside of the inorganic layer comprises:
    forming a mixture layer comprising the polymeric monomer, the initiator, the chain transfer agent, and the repairing microstructure on the outside of the inorganic layer by using a preset process; and heating the mixture layer, so that the polymeric monomer in the mixture layer undergoes a polymerization reaction under the action of the initiator and the chain transfer agent to obtain the organic layer, wherein the preset process comprises an ink-jet printing process or a coating process.

12. The method according to claim 11, wherein heating the mixture layer comprises: heating the mixture layer so that a temperature of the mixture layer is within a preset temperature range, wherein the preset temperature range is 30 degrees Celsius to 70 degrees Celsius.

13. The method according to claim 11, wherein before forming the mixture layer comprising the polymeric monomer, the initiator, the chain transfer agent, and the repairing microstructure on the outside of the inorganic layer by using the preset process, the method further comprises:

forming the repairing microstructure; and mixing the polymeric monomer, the initiator, the chain transfer agent, and the repairing microstructure.

14. The method according to claim 10, wherein forming the inorganic layer coated on the display device on the outside of the display device comprises:

forming the inorganic layer coated on the display device on the outside of the display device using a thin film encapsulation chemical vapor deposition process.

15. A display apparatus, wherein the display apparatus comprises: a display device and an encapsulation structure according to claim 1, wherein the display device comprises an OLED device or a QLED device.

\* \* \* \* \*